United States Patent
Park et al.

(10) Patent No.: US 7,567,028 B2
(45) Date of Patent: Jul. 28, 2009

(54) ORGANIC ELECTROLUMINESCENT DEVICE HAVING SUPPORTING PLATE AND METHOD OF FABRICATING THE SAME

(75) Inventors: Jae-Yong Park, Gyeonggi-do (KR); Nam-Yang Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 576 days.

(21) Appl. No.: 11/022,769

(22) Filed: Dec. 28, 2004

(65) Prior Publication Data

US 2005/0140260 A1 Jun. 30, 2005

(30) Foreign Application Priority Data

Dec. 29, 2003 (KR) .................. 10-2003-0099355

(51) Int. Cl.
*H05B 33/14* (2006.01)
*H01J 1/62* (2006.01)
*G09G 5/00* (2006.01)

(52) U.S. Cl. .............. 313/504; 313/507; 313/512; 313/506; 445/24; 445/25; 345/204

(58) Field of Classification Search ........... 313/504, 313/506; 156/297; 438/29; 257/682
See application file for complete search history.

(56) References Cited

U.S. PATENT DOCUMENTS

| | | | | |
|---|---|---|---|---|
| 5,729,315 A * | 3/1998 | Takahashi et al. | ........... | 349/149 |
| 5,909,081 A * | 6/1999 | Eida et al. | ........... | 313/504 |
| 6,064,151 A * | 5/2000 | Choong et al. | ........... | 313/504 |
| 6,597,113 B1 * | 7/2003 | Nitta | ........... | 313/581 |
| 6,641,933 B1 * | 11/2003 | Yamazaki et al. | ........... | 428/690 |
| 6,674,245 B2 * | 1/2004 | Ko et al. | ........... | 315/169.3 |
| 6,879,493 B2 * | 4/2005 | Kimura et al. | ........... | 361/763 |
| 6,887,592 B2 * | 5/2005 | Hieda et al. | ........... | 428/690 |
| 6,940,476 B2 * | 9/2005 | Ko | ........... | 345/76 |
| 2003/0094612 A1 * | 5/2003 | Yamazaki et al. | ........... | 257/59 |
| 2004/0264212 A1 * | 12/2004 | Chung et al. | ........... | 362/561 |
| 2005/0116235 A1 * | 6/2005 | Schultz et al. | ........... | 257/79 |

FOREIGN PATENT DOCUMENTS

| | | | |
|---|---|---|---|
| KR | 10-1998-080313 | * | 3/1998 |
| KR | 10-0256289 B | | 2/2000 |
| KR | 10-0464864 B | | 12/2004 |

OTHER PUBLICATIONS

Nitta, Korean Patent publication, 10-1998-080313, Mar. 1998, machine translation.*

* cited by examiner

*Primary Examiner*—Sikha Roy
*Assistant Examiner*—Tracie Green
(74) *Attorney, Agent, or Firm*—Morgan Lewis & Bockius LLP

(57) ABSTRACT

An organic electroluminescent device includes: an array element layer having a pad on a first substrate having first and second sides; an organic electroluminescent diode connected to the array element, the organic electroluminescent diode emitting light in an opposite direction away from the first substrate; a printed circuit board adjacent to a backside of the first substrate, the printed circuit board supplying the array element with external signals through the pad; and a supporting plate between the first substrate and the printed circuit board, the supporting plate having better thermal conductivity than the first substrate.

35 Claims, 16 Drawing Sheets emission direction

ORGANIC ELECTROLUMINESCENT DEVICE HAVING SUPPORTING PLATE AND METHOD OF FABRICATING THE SAME

The present invention claims the benefit of Korean Patent Application No. 2003-0099355 filed in Korea on Dec. 29, 2003, which is hereby incorporated by reference.

BACKGROUND OF THE INVENTION

1. Field of the Invention

The present invention relates to a display device, and more particularly, to an organic electroluminescent device and a method of fabricating the same.

2. Discussion of the Related Art

In general, an organic electroluminescent device (ELD) emits light by injecting electrons from a cathode and holes from an anode into an emission layer, combining the electrons with the holes, generating an exciton, and transitioning the exciton from an excited state to a ground state. In comparison to a liquid crystal display (LCD) device, an additional light source is not necessary for the organic ELD to emit light because the transition of the exciton between the two states causes light to be emitted. Accordingly, the size and weight of the organic ELD are less than an LCD device. The organic ELD has other excellent characteristics, such as low power consumption, superior brightness, and a fast response time. Because of these characteristics, the organic ELD is seen as the display for the next-generation of consumer electronic applications, such as cellular phones, car navigation system (CNS), personal digital assistants (PDA), camcorders, and palmtop computers. Moreover, since fabricating the organic ELD is done with fewer processing steps, the organic ELD is much cheaper to produce than an LCD device.

Two different types of organic ELDs exist: passive matrix and active matrix. While both the passive matrix organic ELD and the active matrix organic ELD have a simple structure and are formed by a simple fabricating process, the passive matrix organic ELD requires a relatively large amount of power to operate. In addition, the display size of a passive matrix organic ELD is limited by the width and thickness of conductive lines used in the structure. Further, as the number of conductive lines increases, the aperture ratio of a passive matrix organic ELD decreases. In contrast, active matrix organic ELDs are highly efficient and can produce a high-quality image on a large display with a relatively low power.

FIG. 1 is a cross-sectional view of an organic ELD in which emission light is transmitted toward a bottom direction according to a first comparative example of a related art. As shown in FIG. 1, an array element layer 14 including a thin film transistor (TFT) T is formed on a first substrate 12 including a pixel region P. A first electrode 16, an organic electroluminescent (EL) layer 18, and a second electrode 20 are formed over the array element layer 14. The organic EL layer 18 can separately display red, green, and blue colors for each pixel region P. A second substrate 28 faces the first substrate 12 and is spaced apart from the first substrate 12.

The first and the second substrates 12 and 28 are attached to each other with a sealant 26. The second substrate 28 includes a desiccant 22 to eliminate moisture and oxygen that may penetrate into a capsule of the organic EL layer 18. The desiccant 22 is fixed by a holding element 25.

The first electrode 16 or lower electrode is transparent and the second electrode 20 or upper electrode is nontransparent. Light emission from the organic EL layer 18 is transmitted toward the first electrode 16. Therefore, this organic ELD may be referred as a bottom emission type.

A pad 40 is formed on the first substrate 12 in a periphery region of the seal pattern 26. An external circuit means EC is connected to the pad 40 to supply the array element layer 14 with signals. The external circuit means EC has a tape carrier package (TCP) 44 including a drive integrated circuit (IC) 42 directly connected to the pad 40 and a printed circuit board (PCB) 46 connected to the TCP 44 to supply the signals.

In the bottom emission type, the external circuit means EC is located adjacent to a top surface of the second substrate 28. More specifically, the PCB 46 is attached on a backside of the second substrate 28 and the TCP 44 connected to the pad 40 and the PCB 46 in a bent shape. However, it is substantially difficult to obtain high brightness in a transmissive region in this bottom emission type because the emission light is transmitted through the array element layer 14 having a plurality of opaque metal lines. Therefore, a top emission type organic ELD has been suggested in which light emission is transmitted in a top direction, which is in an opposite direction of the bottom emission type, in order to solve the above-mentioned problems.

FIG. 2 is a cross-sectional view of an organic ELD according to a second comparative example of the related art. As shown in FIG. 2, a top emission type organic ELD 80 includes an array element layer 64 on a substrate 62 having a pad 90, a first opaque electrode 66, an organic EL layer 68 on the first opaque electrode 66, and a second transparent electrode 70. For example, when the first electrode 66 acts as an anode and the second electrode 70 acts as a cathode, the first electrode 66 includes a transparent material having a high work-function and the second electrode 70 includes an opaque material having a low work-function. In this case, it is difficult for the first electrode 66 to be completely opaque and for the second electrode to be completely transparent. Therefore, the first electrode 66 also includes an opaque conductive material while the second electrode 70 is a metallic material thin enough to allow light transmission to occur.

A passivation layer 96 is formed on an entire surface of the second electrode 70 to protect the organic ELD 80. In other words, the passivation layer 96 covers the surfaces of the array element layer 64 and the organic EL layer 68. Moreover, as explained in reference to FIG. 1, an external circuit means 94 is connected to the array element layer 64 through a pad 90 in a periphery region of the substrate 62. In comparison with the bottom emission type organic ELD shown in FIG. 1, the external circuit means EC is located adjacent to a bottom surface of the substrate 62, as shown in FIG. 2. Therefore, the PCB 96 is mounted on a backside of the substrate 62 and the TCP 94 is located between the pad 90 of the substrate 62 and the PCB 96 as a bent shape corresponding to a side portion of the substrate 62.

The portion of the substrate 62 for attaching the TCP 94 having a drive IC 92 needs to be at least about 2~3 mm. Moreover, it is difficult for the PCB 96 to be completely attached to the substrate 62. More specifically, a detachment phenomenon of the TCP 94 occurs as a result of impact tests for reliability. Further, the organic ELD 80 may easily overheat because the above-mentioned top emission type organic ELD has a structure in which heat generated by the organic EL layer 68 can not be readily dissipated.

SUMMARY OF THE INVENTION

Accordingly, the present invention is directed to an organic ELD and a fabricating method thereof that substantially obviate one or more of the problems due to limitations and disadvantages of the related art.

An object of the present invention is to provide an organic EL device and a method of fabricating the same that can prevent overheating.

Another object of the present invention is to provide an organic EL device and a method of fabricating the same with a stably affixed external circuit means.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes: an array element layer having a pad on a first substrate having first and second sides; an organic electroluminescent diode connected to the array element, the organic electroluminescent diode emitting light toward an opposite direction to the first substrate; a printed circuit board adjacent to a backside of the first substrate, the printed circuit board supplying the array element with external signals through the pad; and a supporting plate between the first substrate and the printed circuit board, the supporting plate having a better thermal conductivity than the first substrate.

In another aspect, a method of fabricating an organic electroluminescent device includes: forming an array element layer having a pad on a first substrate including first and second sides; forming an organic electroluminescent diode connected to the array element, the organic electroluminescent diode emitting light toward an opposite direction to the first substrate; mounting a printed circuit board adjacent to a backside of the first substrate, the printed circuit board supplying the array element with external signals through the pad; and attaching a supporting plate between the first substrate and the printed circuit board, the supporting plate having a better thermal conductivity than the first substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

DETAILED DESCRIPTION OF THE ILLUSTRATED EMBODIMENTS

Reference will now be made in detail to the illustrated embodiments of the present invention, examples of which are illustrated in the accompanying drawings. An organic ELD can be a single panel type in which an array element layer and an organic EL diode are formed in a single panel, or a dual panel type in which the array element layer and the organic EL diode are formed on their own respective substrates. Wherever possible, the same reference numbers will be used throughout the drawings to refer to the same or like parts.

Figure 1:
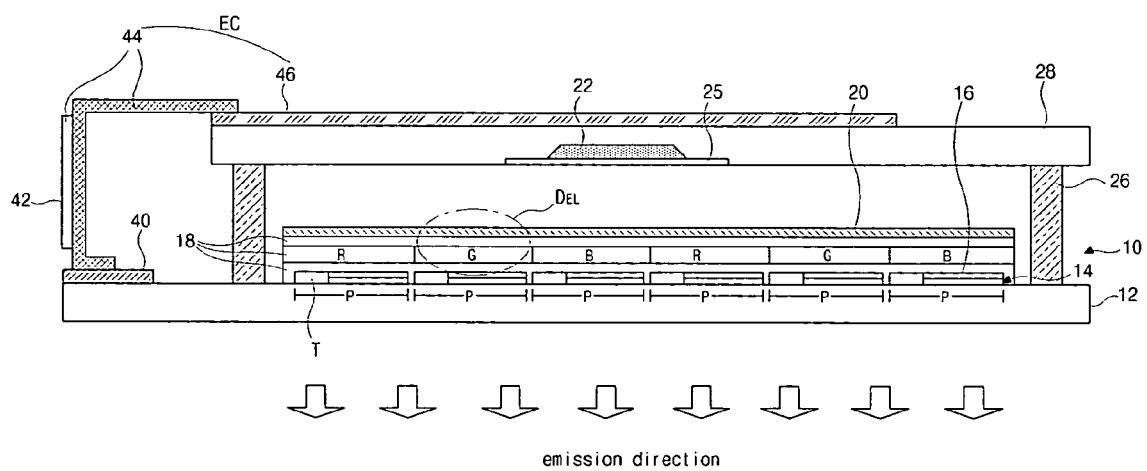
FIG. 1 is a cross-sectional view of an organic ELD in which emission light is transmitted toward a bottom direction according to a first comparative example of a related art.
Figure 2:
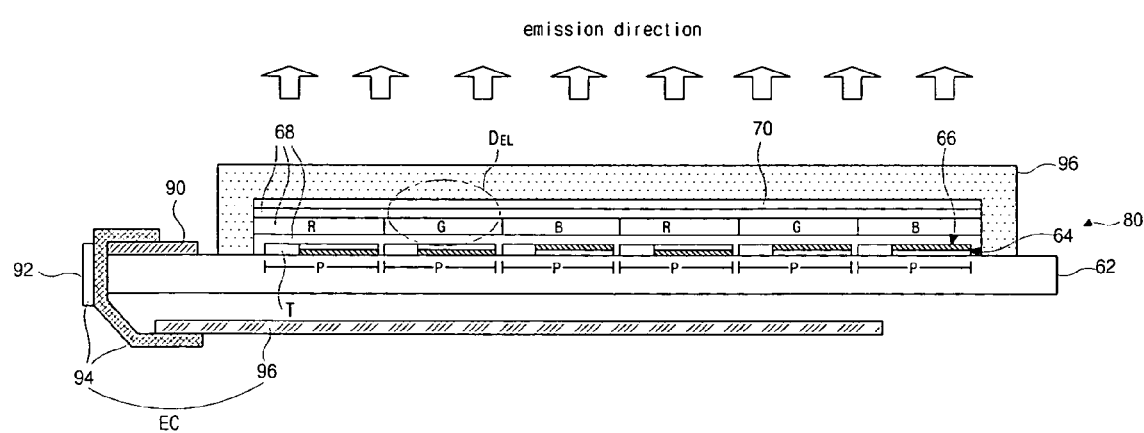
FIG. 2 is a cross-sectional view of an organic ELD according to a second comparative example of the related art.
Figure 3A:
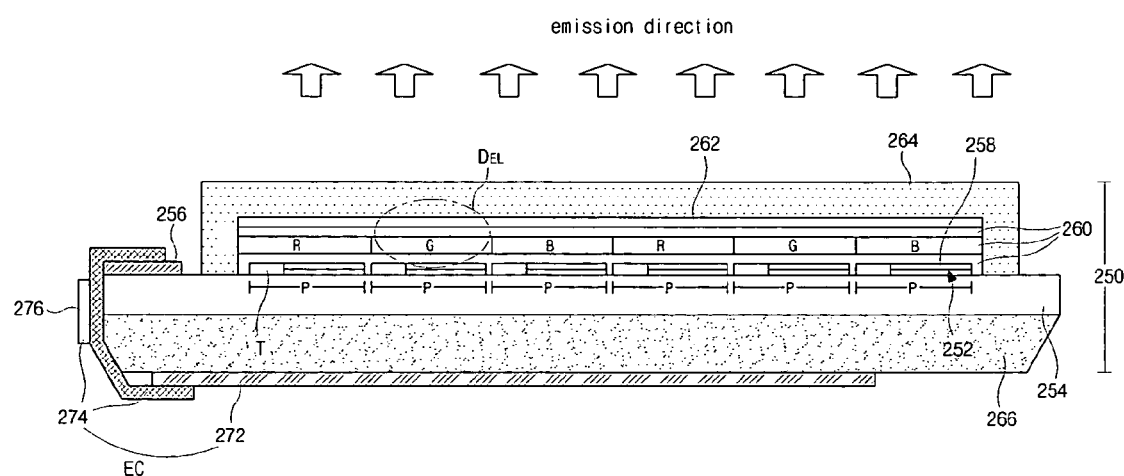
FIGS. 3A and 3B are cross-sectional views of a top emission type organic ELD according to an embodiment of the present invention.
Figure 3B:
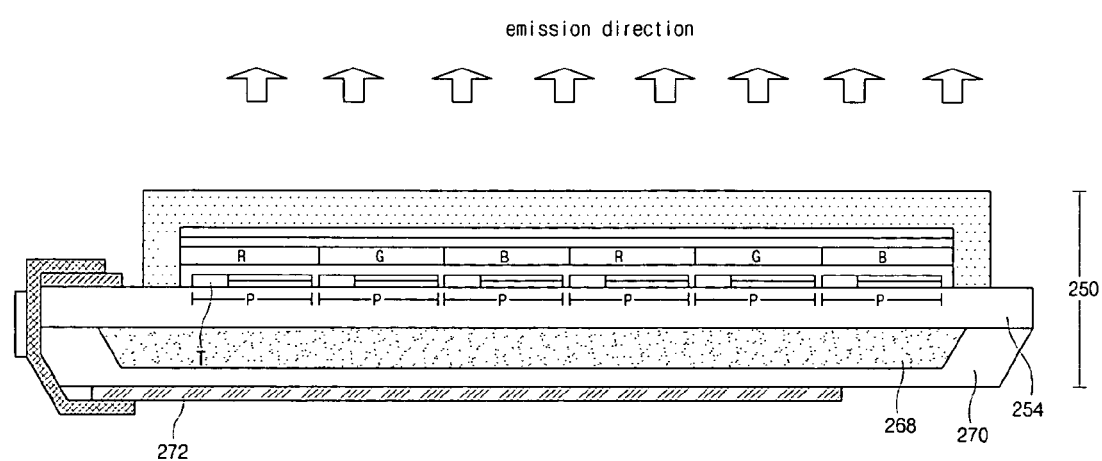

FIGS. 3A and 3B are cross-sectional views of a top emission type organic ELD according to an embodiment of the present invention. As shown in FIG. 3A, a top emission type organic ELD 250 includes an array element layer 252 on a substrate 254 including a pad 256, a first opaque electrode 258, an organic EL layer 260 on the first electrode 258, and a second substantially transparent electrode 262. The first electrode 258, the organic EL layer 260 and the second electrode 262 constitute an organic EL diode $D_{EL}$.

When the first electrode 258 acts as an anode and the second electrode 262 acts as a cathode, the first electrode 258 includes a material having a high work-function and the second electrode 262 includes a material having a low work-function. The first electrode 258 can be made of a transparent conductive material and an opaque metallic material to achieve the high work-function and the second electrode 262 can include a metallic material with a thin thickness to still enable light transmission therethrough.

A passivation layer 264 is formed over the entire surface of the array element layer 252 and the over organic EL layer 260.

A supporting plate 266 is attached on a backside of the substrate 254 and has better thermal conductivity than the substrate 254 to prevent the organic ELD 250 from overheating. The supporting plate 266 includes a carbon composite that can contact the entire backside of the substrate 254.

An external circuit means EC is located adjacent to the backside of the supporting plate 266. The external circuit means EC includes a PCB 272 and a TCP 274. The PCB 272 is mounted on the backside of the supporting plate 266. The TCP 274 includes a drive IC 276 located between the pad 256 of the substrate 254 and the PCB 272. The TCP 274 has a bent shape and cover, a side portion of the substrate 254 and a side portion of the supporting plate 266.

As shown in FIG. 3B, an auxiliary supporting plate 270 can be added between a supporting plate 268 and the PCB 272, wherein the auxiliary supporting plate 270 is larger than the supporting plate 268 and contacts a peripheral portion of the backside of the substrate 254. For example, the supporting plate 268 in FIG. 3B is smaller than the supporting plate 266 in FIG. 3A because the auxiliary supporting plate 270 is added for structural support. The auxiliary supporting plate 270 includes an acrylic resin. Further, the auxiliary supporting plate 270 includes a material having a higher thermal conductivity than the supporting plate 268.

Accordingly, the top emission type organic ELD having the supporting plate has several advantages, such as an attachment point for the external circuit means and preventing overheating of the top emission type organic ELD. Because heat caused by the top emission type organic ELD 250 is diffused outside, improved operating characteristic can be obtained from the top emission type organic ELD 250 and failures can be reduced.

Figure 4:
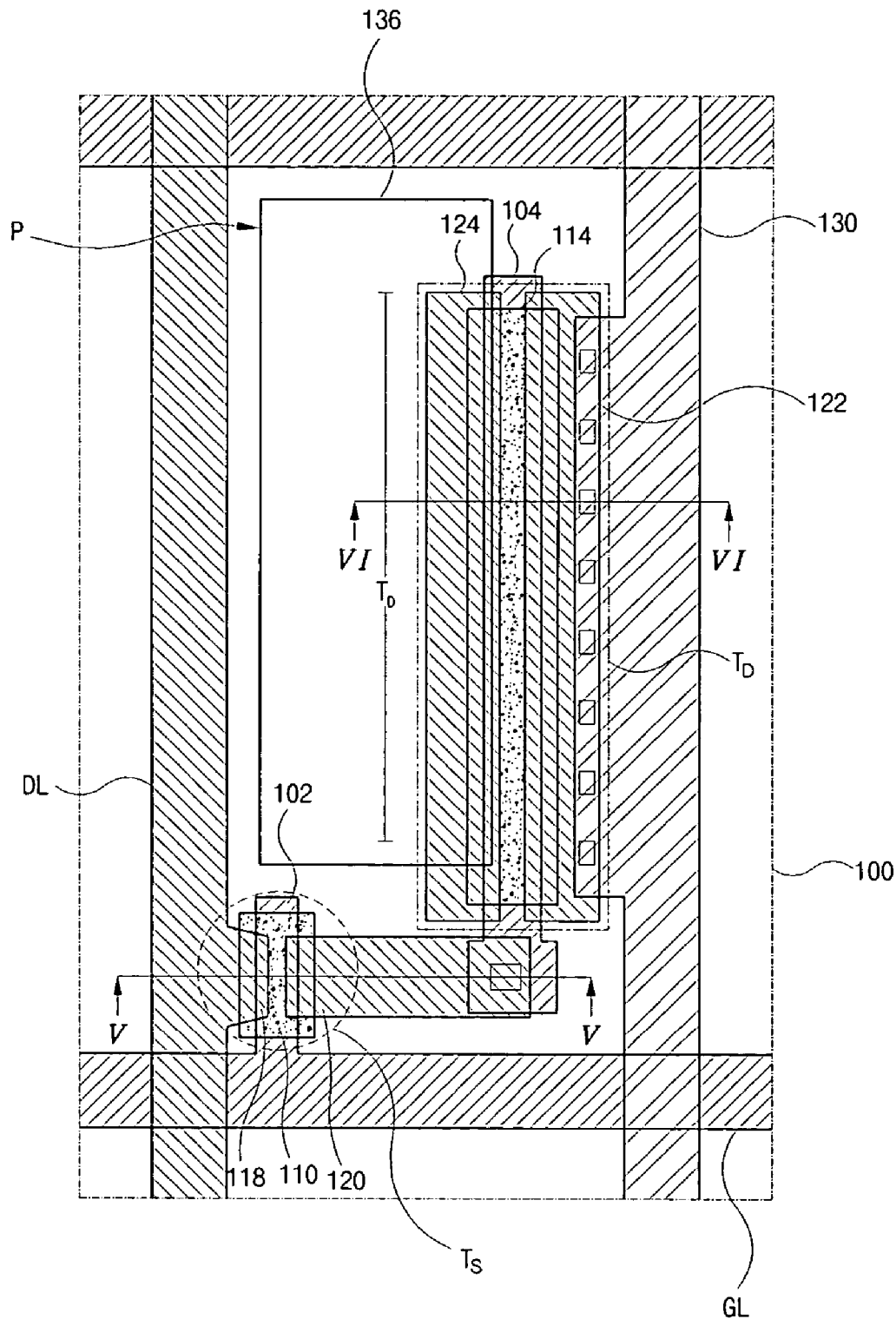
FIG. 4 is a plan view of an organic ELD for one pixel region according to an embodiment of the present invention.

FIG. 4 is a plan view of an organic ELD for one pixel region according to an embodiment of the present invention. As shown in FIG. 4, a gate line GL is formed on a substrate 100 along a first direction, a data line DL crosses the gate line GL in a second direction to define a pixel region P. A power line 130 is arranged in parallel to the data line DL. The power line 130 also crosses the gate line GL. A switching thin film transistor $T_S$ adjacent to the pixel region P is connected to the gate and data lines GL and DL. A driving thin film transistor $T_D$ is connected to the switching thin film transistor $T_S$. In addition, the switching thin film transistor $T_S$ includes a switching gate electrode 102, a switching active layer 110, a switching source electrode 118 and a switching drain electrode 120. The driving thin film transistor $T_D$ includes a driving gate electrode 104, a driving active layer 114, a driving source electrode 122 and a driving drain electrode 124. More specifically, the driving gate electrode 104 is connected to the switching drain electrode 120. The driving source electrode 122 is connected to the power line 130 and the driving drain electrode 124 is connected to the organic EL diode $D_{EL}$ (of FIG. 3). The switching layer 110 and driving active layer 114 can be formed of amorphous silicon (a-Si). The amorphous silicon driving TFT can have a large width to length ratio (W/L ratio) for driving the organic EL diode $D_{EL}$ (of FIG. 3). The W/L ratio of the driving thin film transistor $T_D$ is much larger than the W/L ratio of the switching thin film transistor $T_S$.

A method of fabricating a top emission type organic ELD according an embodiment of the present invention will be described in reference to FIGS. 5A to 5F and 6A to 6F. FIGS. 5A to 5F are cross-sectional views of a method of fabricating a top emission type organic ELD according to an embodiment of the present invention taken along a line V-V of FIG. 4. FIGS. 6A to 6F are cross-sectional views of a method of fabricating a top emission type organic ELD according to an embodiment of the present invention taken along a line VI-VI of FIG. 4.

Figure 5A:
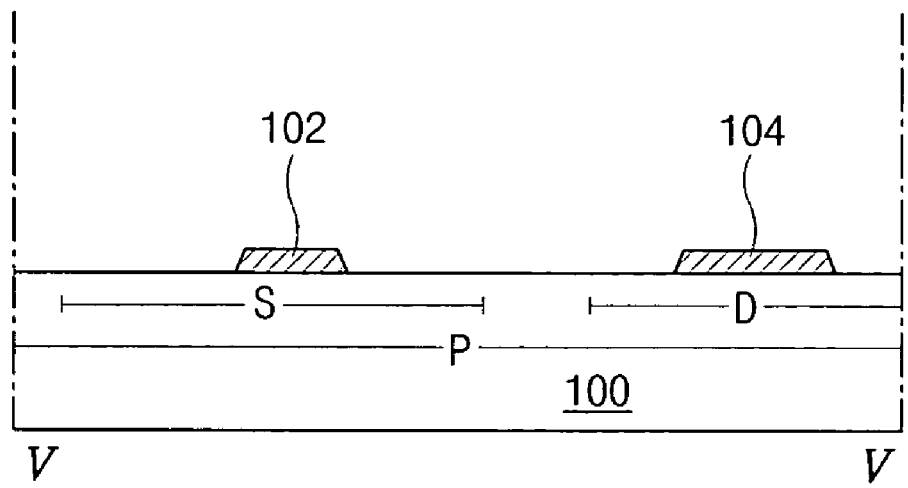
FIGS. 5A to 5F are cross-sectional views of a method of fabricating a top emission type organic ELD according to an embodiment of the present invention taken along a line V-V of FIG. 4.
Figure 6A:
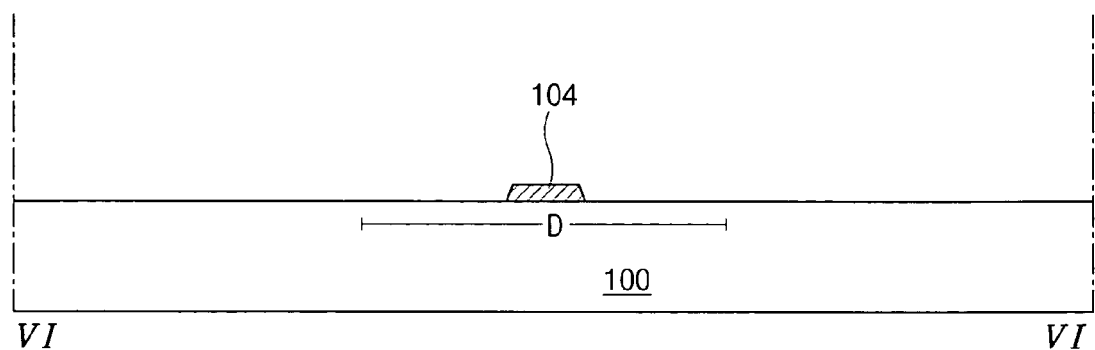
FIGS. 6A to 6F are schematic cross-sectional views of a method of fabricating a top emission type organic ELD according to an embodiment of the present invention taken along a line VI-VI of FIG. 4.

As shown in FIGS. 5A and 6A, a pixel region P including a switching region S and a driving region D is defined on a first substrate 100. In addition, a switching gate electrode 102 and a driving gate electrode 104 are formed by depositing and patterning a metallic material, such as aluminum (Al), Al alloy, copper (Cu), tungsten (W), tantalum (Ta), and molybdenum (Mo), in the switching region S and the driving region D, respectively.

Figure 5B:
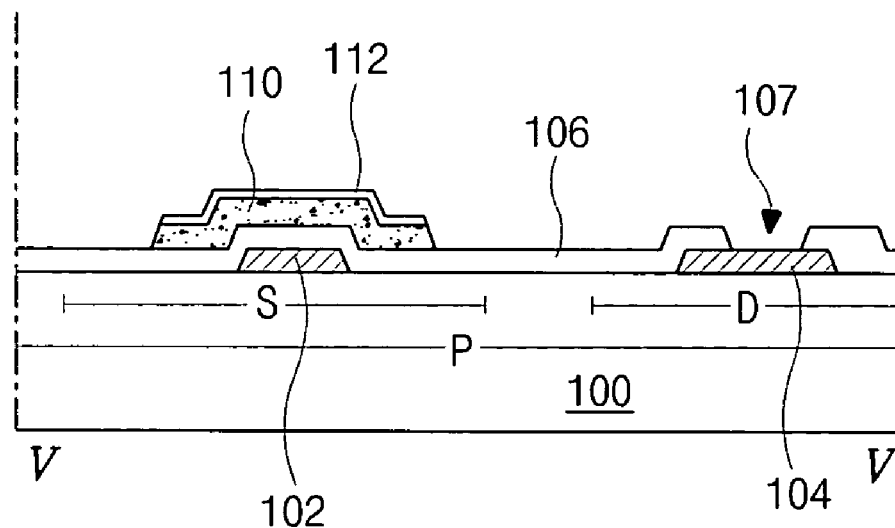
Figure 6B:
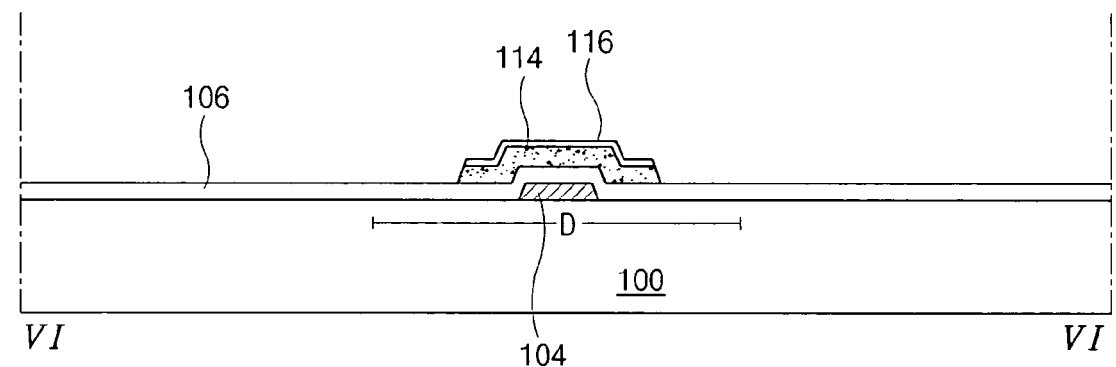

As shown in FIGS. 5B and 6B, a gate-insulating layer 106 is formed by depositing an inorganic insulating material, such as silicon nitride (SiNx) and silicon oxide (SiO$_2$) over an entire surface of the switching gate electrode 102 and the driving gate electrode 104 on the first substrate 100. A switching active layer 110 and a driving active layer 114 are formed by depositing and patterning intrinsic amorphous silicon (a-Si) on the switching gate electrode 102 and driving gate electrode 104, respectively. A switching ohmic contact layer 112 and a driving ohmic contact layer 116 are formed of doped amorphous silicon (n+ or p+ a-Si) that was deposited after the intrinsic amorphous silicon (a-Si) and patterned during the patterning of the intrinsic amorphous silicon (a-Si). In addition, a first contact hole 107 that exposes an end portion of the driving gate electrode 104 is formed in the gate insulating layer 106.

Figure 5C:
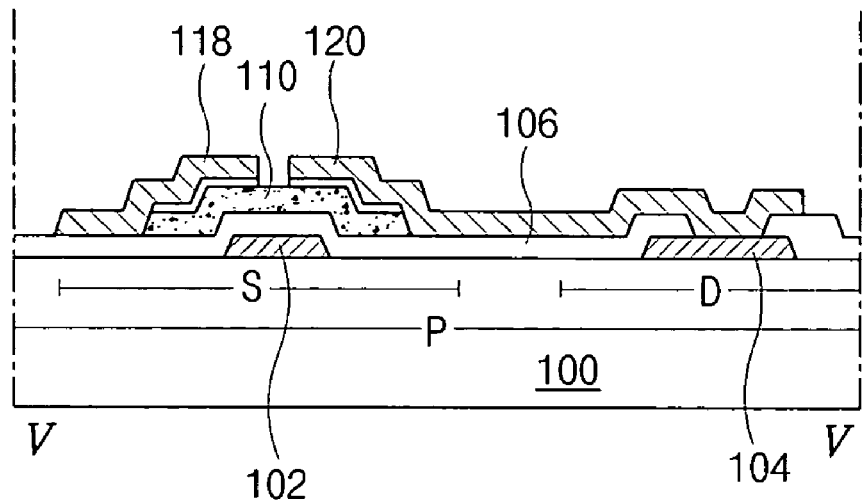
Figure 6C:
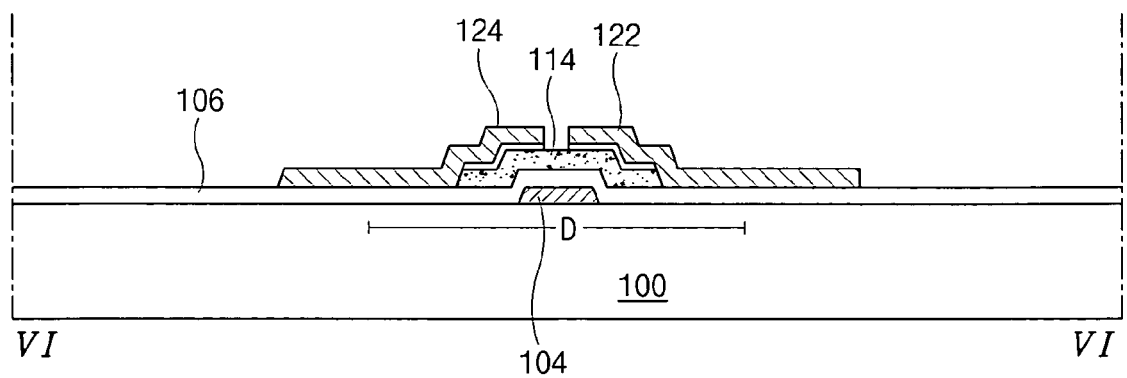

As shown in FIGS. 5C and 6C, a switching source electrode 118, a driving source electrode 122, a switching drain electrode 120 and a driving drain electrode 124 are formed by depositing and patterning a metallic material, such as chromium (Cr), Mo, Ta, and W on the switching ohmic contact layers 112 and the driving ohmic contact layers 116, respectively. In addition, the switching source electrode 118, the driving source electrode 122 are spaced apart from each other. Further, the switching source electrode 120 and the driving drain electrode 124 are spaced apart from each other.

Figure 5D:
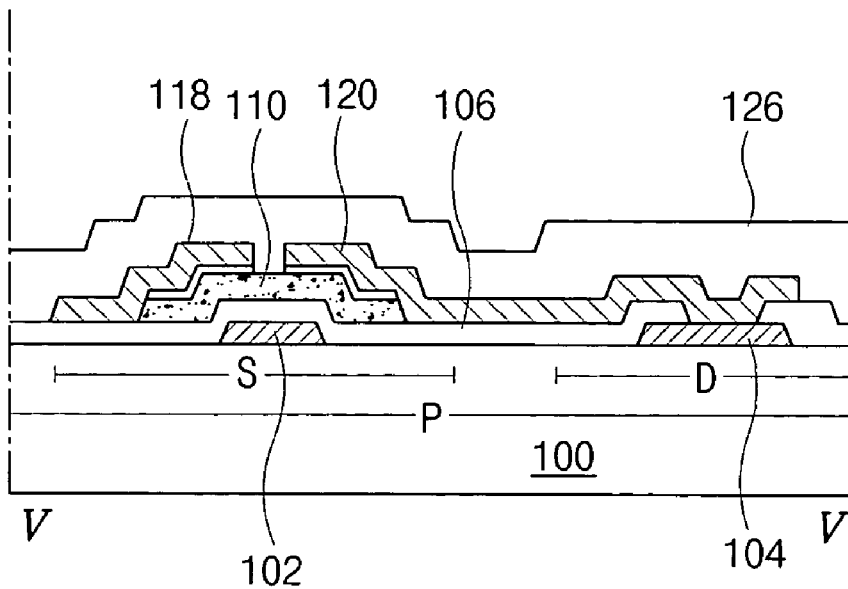
Figure 6D:
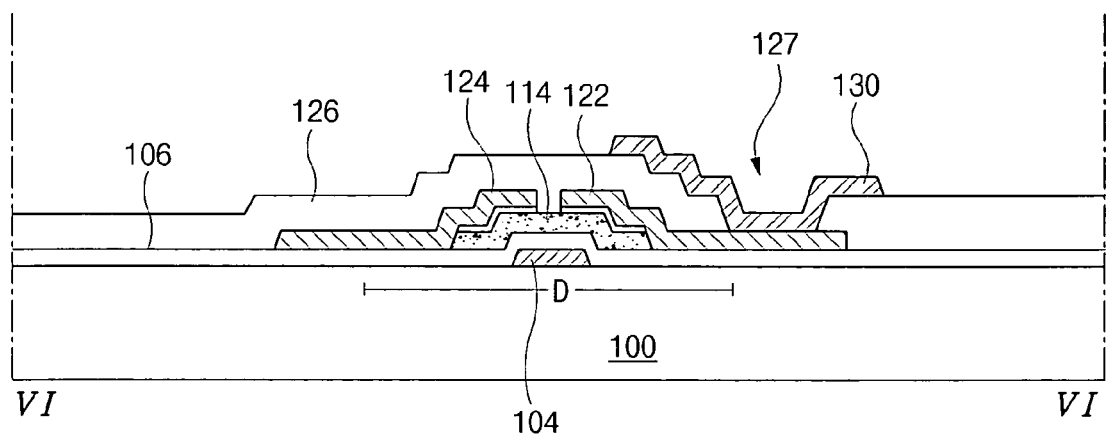

As shown in FIGS. 5D and 6D, a first passivation layer 126 is formed by depositing an inorganic insulating material over an entire surface of both the switching and driving source electrodes 118 and 122, and both the switching and driving drain electrodes 120 and 124. In addition, the first passivation layer 126 has a second contact hole 127 that exposes a portion of the driving source electrode 122. Then, a power line 130 is formed by depositing and patterning a metallic material on the first passivation layer 126 and is connected to the driving source electrode 122 via the second contact hole 127. The power line 130 may be made of the same material as the source and drain electrodes 118 and 122, or 120 and 124.

Figure 5E:
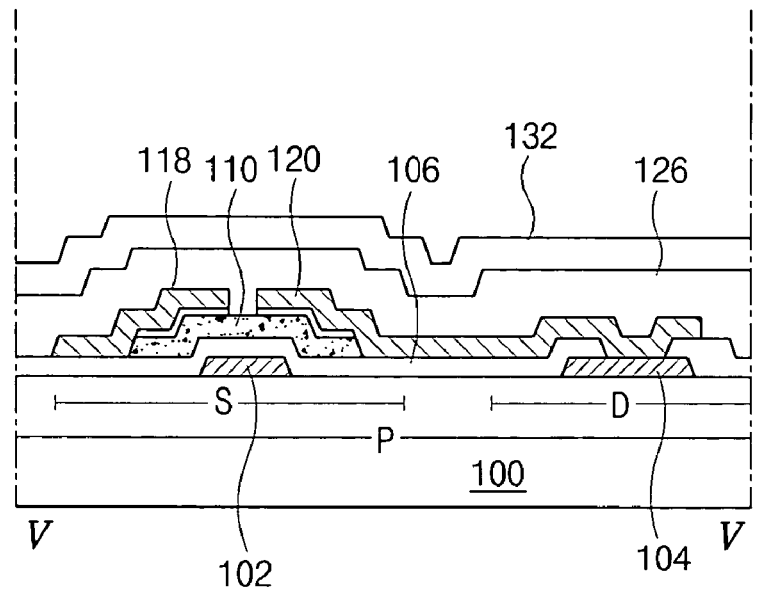
Figure 6E:
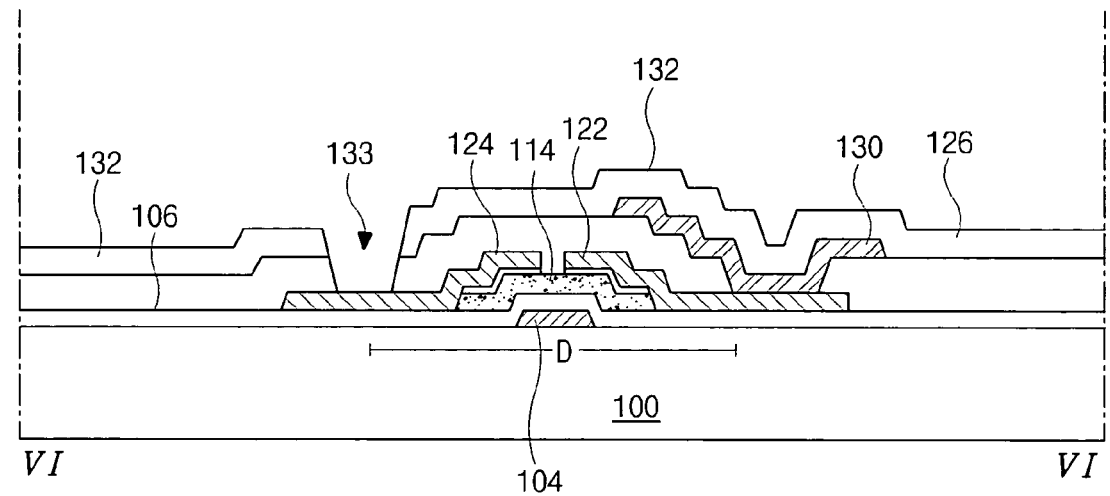

As shown in FIGS. 5E and 6E, a second passivation layer 132 is formed over an entire surface of the power line 130. For example, the second passivation layer 132 is formed by depositing an inorganic insulating material, such as benzocylcobutene (BCB), or by coating an organic insulating material, such as acrylate resin, over an entire surface of the power line 130. A third contact hole 133 exposing a portion of the driving drain electrode 124 is formed by etching a portion of the second passivation layer 132 and the first passivation layer 126.

Figure 5F:
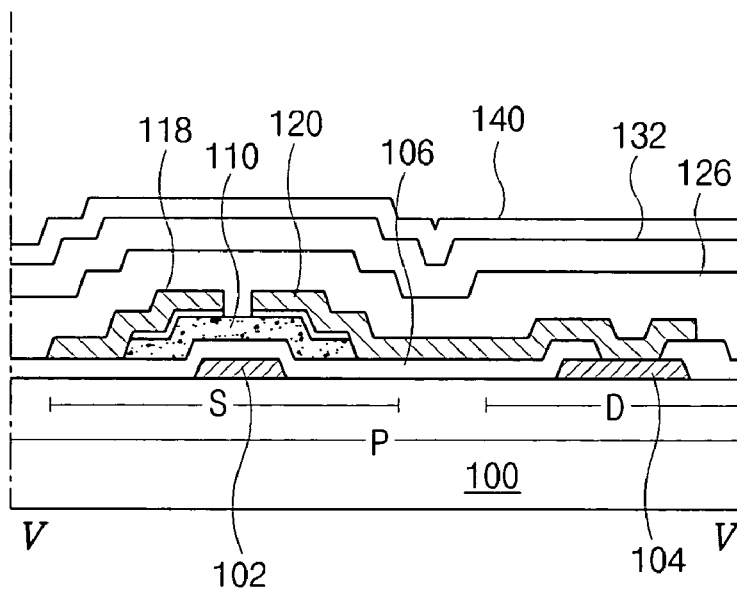
Figure 6F:
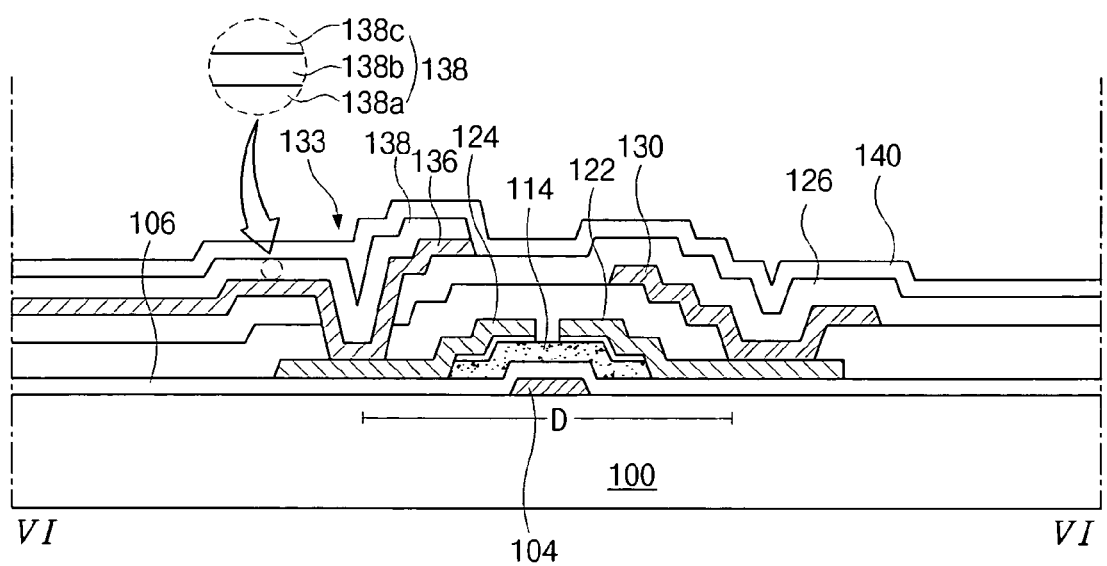

As shown in FIGS. 5F and 6F, a first electrode 136 is formed by depositing and patterning a conductive material on the second passivation layer 132 in a sub-pixel region P and is connected to the driving drain electrode 124 via the third contact hole 133. When the first electrode 136 acts as an anode in a top emission type device, it further includes an opaque metallic material having a high work-function. For example, when the first electrode 136 is an anode and a second electrode that will be formed later is a cathode, the organic EL layer 138 includes a hole transporting layer 138a, an emitting layer 138b and an electron transporting layer 138c. A second electrode 140 is formed over an entire surface of the organic EL layer 138. When the second electrode 140 acts as a cathode in the top emission type, a metallic material having a low work-function having a thickness sufficiently thin to enable light transmission therethrough is used as the second electrode.

Although not shown, a passivation layer for encapsulating is formed on an entire surface of the second electrode 140 and the supporting layers 266 and 268 (of FIGS. 3A and 3B). The supporting layers 266 and 268 have better thermal conductivity than the substrate 100. However, as explained above, a top emission type organic ELD can have a structure in which the array element layer and the organic EL diode are formed on the same panel, so the materials for forming the first and second electrodes as anode and cathode are limited due to transparency and work-function requirements for each of respective electrodes. A dual panel type organic ELD does not have such a limitation in selecting materials for an anode and cathode in a top emission type organic ELD.

Figure 7:
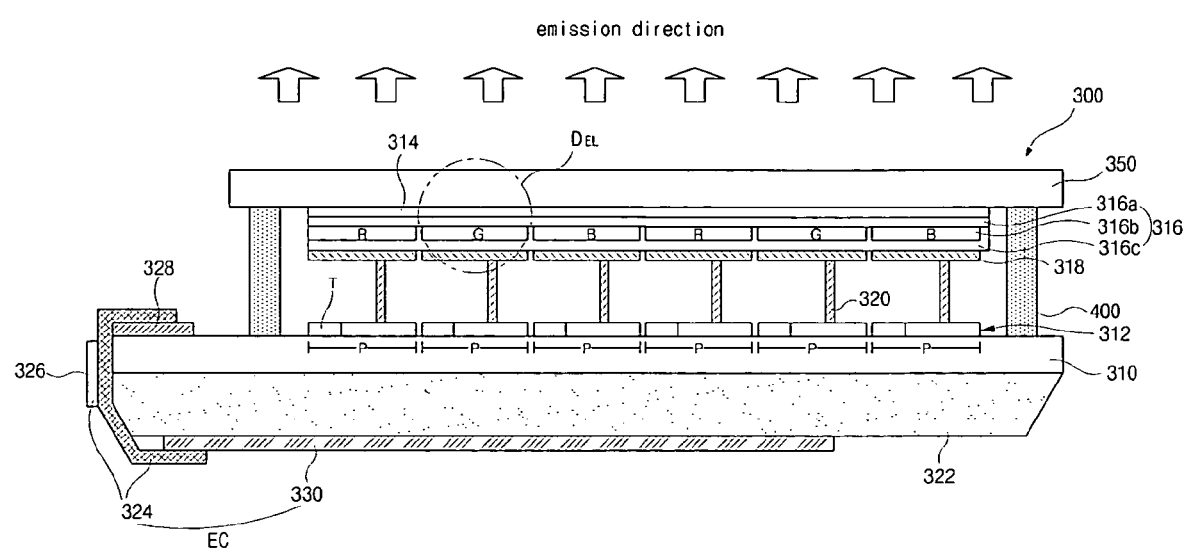
FIGS. 7 and 8 are cross-sectional views of a dual panel type organic ELD in which light emission is transmitted toward a top direction according to an embodiment of the present invention.
Figure 8:
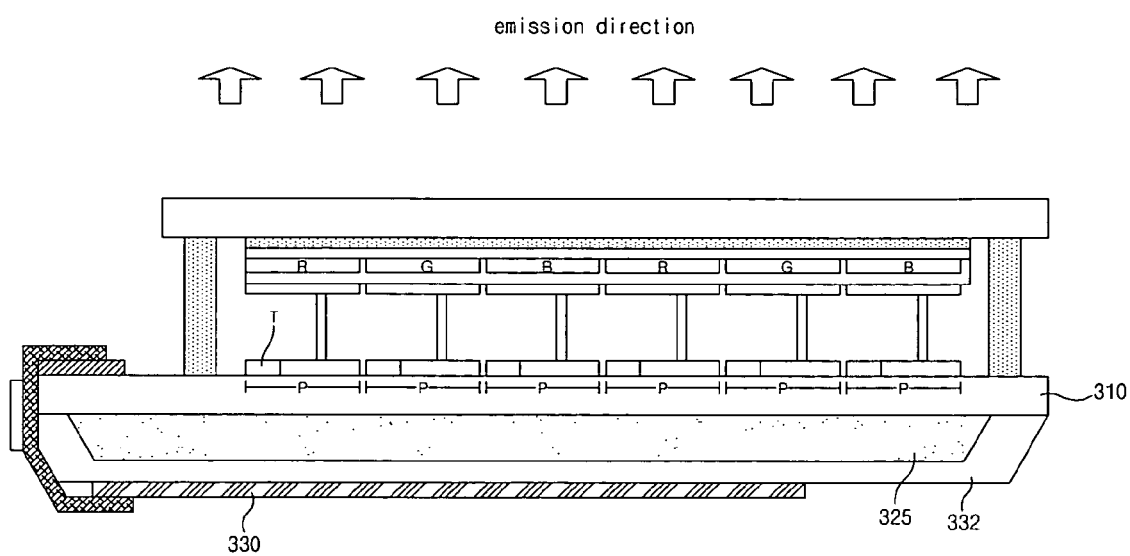

FIGS. 7 and 8 are cross-sectional views of a dual panel type organic ELD in which light emission light is transmitted toward a top direction according to embodiments of the present invention. As shown in FIG. 7, each of the first substrate 310 and the second substrate 350 includes a plurality of sub-pixel region, P that face each other and are spaced apart from each other. An array element layer 312, including a thin film transistor T, is formed on the first substrate 310. An organic EL diode $D_{EL}$, including a first electrode 314, an organic EL layer 316 and a second electrode 318, is formed on the second substrate 350. A connection electrode 320 is formed between the array element layer 312 and the organic EL diode $D_{EL}$ to connect the array element layer 312 and the organic EL diode $D_{EL}$.

Although not shown, the thin film transistor T includes a switching thin film transistor and a driving thin film transistor connected to the switching thin film transistor in each sub-pixel region P. Because the dual panel type organic ELD 300 is a top emission type, the first electrode 314 is substantially transparent and the second electrode 318 is opaque. When the first electrode 314 acts as an anode and the second electrode 318 acts as a cathode, the first electrode 314 includes a transparent conductive material, such as indium tin oxide (ITO) and the second electrode 318 comprises an opaque metallic material, such as aluminum (Al), calcium (Ca), magnesium (Mg), lithium fluorine/aluminum (LiF/Al), or the like. In this case, the organic EL layer 316 includes a hole transporting layer 316a on the first electrode 314, an emitting layer 316b on the hole transporting layer 316a, and an electron transporting layer 316c on the emitting layer 316b.

A supporting plate 322 having better thermal conductivity than the first substrate 310 is located on a backside of the first substrate 310. The supporting plate 322 includes a carbon composite. The supporting plate 322 contacts the first substrate 310 and can contact the entire bottom surface area of the first substrate 310. A pad 328 is formed in a peripheral region of the first substrate 310. An external circuit means EC is located adjacent to the backside of the first substrate in a direction opposite to the emission direction. The external circuit means EC includes a PCB 330 and a TCP 324. The PCB 330 is mounted on the backside of the supporting plate 322. The TCP 324 includes a drive IC 326 located between the pad 328 of the first substrate 310 and the PCB 330. The PCB 330 has a bent shape covering a side portion of the first substrate 310 and the supporting plate 322.

As shown in FIG. 8, an auxiliary supporting plate 332 is added between a supporting plate 325 and the PCB 330, wherein the auxiliary supporting plate 326 is bigger than the supporting plate 325 and contacts a peripheral portion of the backside of the first substrate 310. For example, the supporting plate 325 in FIG. 8 is smaller than the supporting plate 322 in FIG. 7 because the auxiliary supporting plate 332 is added for additional substantial support. The auxiliary supporting plate 332 includes an acrylic resin. Further, the auxiliary supporting plate 332 can include a material having a higher thermal conductivity than the supporting plate 325.

Figure 9A:
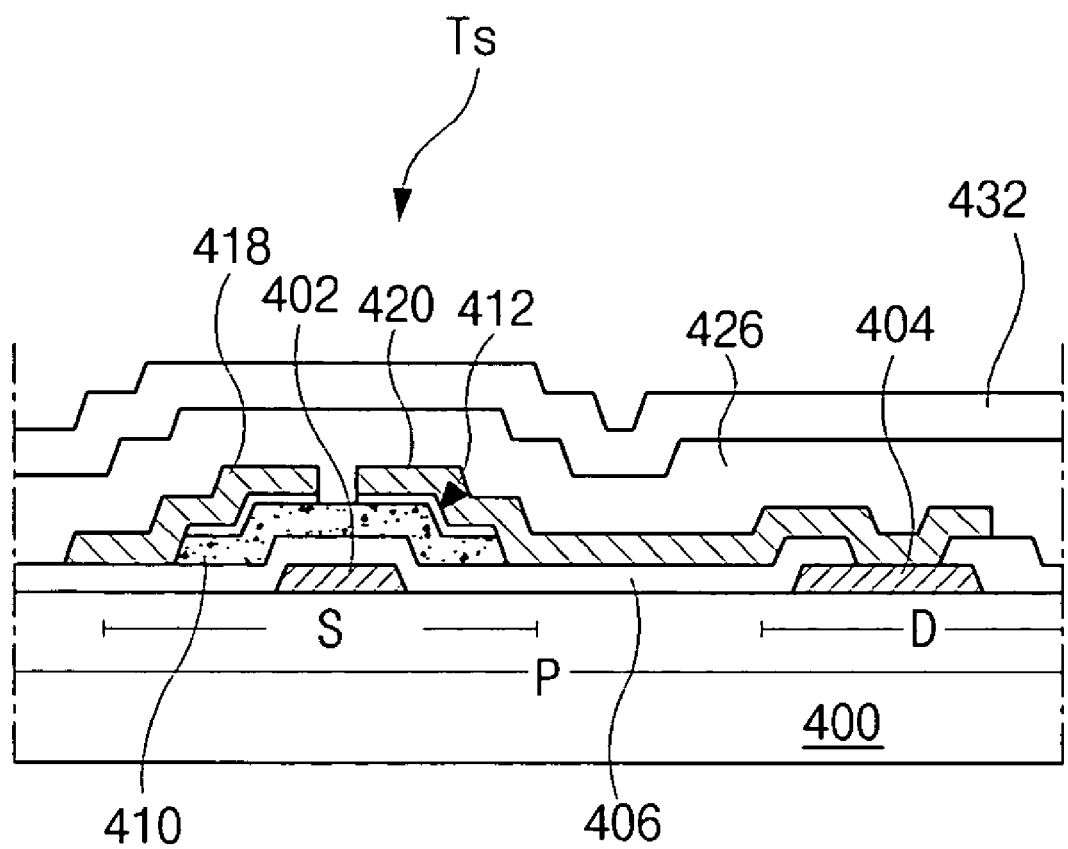
FIGS. 9A and 9B are cross-sectional views of an array substrate for a dual panel type organic ELD in which light emission is transmitted toward a top direction according to an embodiment of the present invention.
Figure 9B:
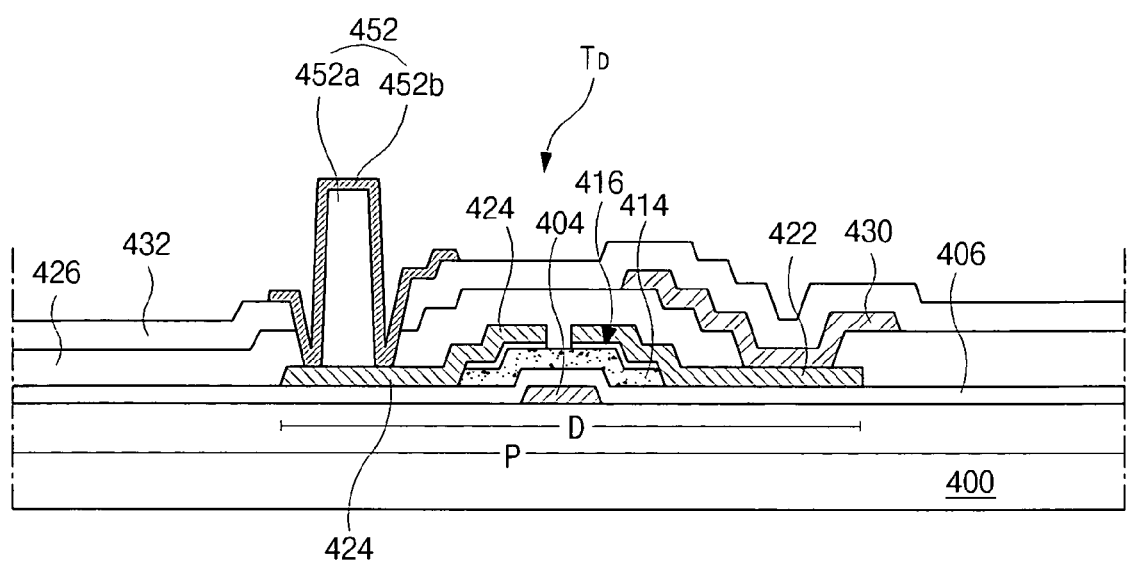

FIGS. 9A and 9B are cross-sectional views of an array substrate for a dual panel type organic ELD in which light emission is transmitted toward a top direction according to an embodiment of the present invention. A pixel region P including a switching region S and a driving region D is defined in a first substrate 400. Switching and driving gate electrodes 402 and 404 are formed in the switching region S and the driving region D, respectively. A gate-insulating layer 406 is formed on an entire surface of the switching gate electrode 402 and the driving gate electrode 404. A switching active layer 410 and a driving active layer 414 are sequentially formed on the switching and driving gate electrodes 402 and 404, respectively. Switching ohmic contact layers 412 and driving ohmic contact layers 416 are formed on the switching active layer 410 and the driving active layer 414, respectively. Further, spaced apart switching source and drain electrodes 418 and 420 are formed on the switching ohmic contact layers 412, respectively. Furthermore, spaced apart driving source and drain electrodes 423 and 424 are formed on the driving ohmic contact layers 412 and 416, respectively.

The switching gate electrode 402, the switching active layer 410, the switching ohmic layer 412, the switching source electrode 418 and the switching drain electrode 420 constitute a switching thin film transistor Ts. The driving gate electrode 404, the driving active layer 414, the driving ohmic layer 416, the driving source electrode 422 and the driving drain electrode 424 constitute a driving thin film transistor $T_D$. A first passivation layer 426 is formed on an entire surface of the switching and driving thin film transistors Ts and $T_D$. A power line 430 is formed on the first passivation layer 426 and is connected to the driving source electrode 422. A second passivation layer 432 is formed on an entire surface of the power line 430.

A connection electrode 452 is formed on the second passivation layer 432 and is connected to the driving drain electrode 424. Because the connection electrode 452 connects the array element layer 312 (of FIG. 7) and the organic EL diode $D_{EL}$ (of FIG. 7) therebetween, it should have a height corresponding to a gap between the array element layer 312 (of FIG. 7) and the organic EL diode $D_{EL}$ (of FIG. 7). For example, the connection electrode 452 can include an organic pattern 452a covered by a metal layer 452b to achieve a predetermined height so that a conductive path can be formed between the array element layer 312 and and the organic EL diode $D_{EL}$.

Figure 10A:
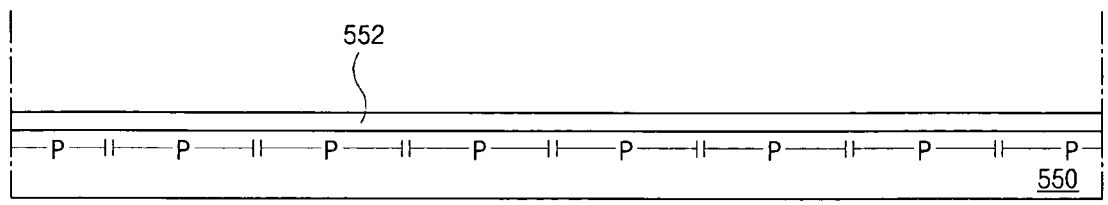
FIGS. 10A-10C are cross-sectional views of a method of fabricating an organic EL diode substrate a dual panel type organic ELD in which light emission is transmitted toward a top direction according to an embodiment of the present invention.
Figure 10B:
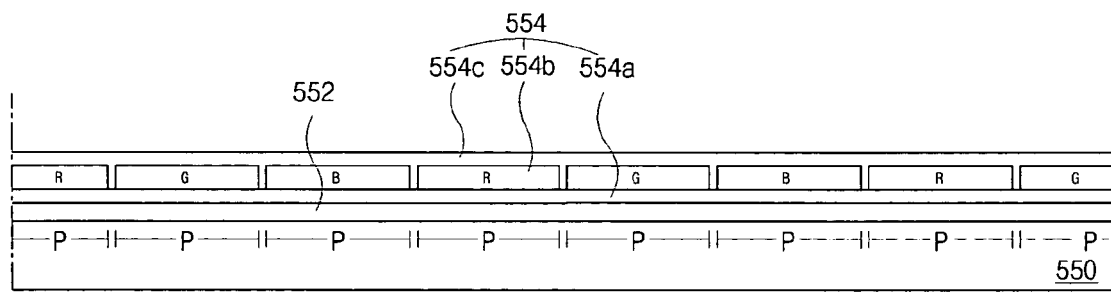
Figure 10C:
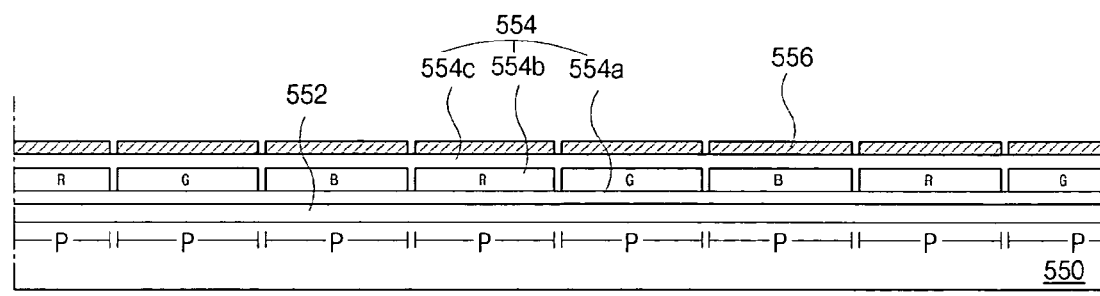

FIGS. 10A and 10C are schematic cross-sectional views of a method of fabricating an organic EL diode substrate a dual panel type organic ELD in which light emission is transmitted toward a top direction according to an embodiment of the present invention. As shown in FIG. 10A, a first electrode 552 is formed with a transparent conductive material on a substrate 550 including a plurality of sub-pixel regions P. The transparent conductive material may include indium tin oxide (ITO) having a high work-function.

As shown in FIG. 10B, an organic EL layer 554 is formed on the first electrode 552 and includes red, green and blue EL layers (not shown) in sub-pixel regions P that are in repeating order. Specifically, the organic EL layer 554 includes a hole transporting layer 554a on the first electrode 552, an emitting layer 554b on the hole transporting layer 554a, and an electron transporting layer 554c on the emitting layer 554b when the first electrode 552 acts as an anode and a second electrode 556 that will be formed later acts as a cathode.

As shown in FIG. 10C, a second electrode 556 is formed on an entire surface of the organic EL layer 554. For example, the second electrode 556 should be non-transparent. In this case, the second electrode 556 comprises an opaque metallic material, such as aluminum (Al), calcium (Ca), magnesium (Mg), lithium fluorine/aluminum (LiF/Al), or the like.

As explained above, the array substrate as shown in FIGS. 9A and 9B and the organic EL diode substrate as shown in FIGS. 10A to 10C comprise a dual panel type organic ELD in which light emission is a top emission type. The panels are attached to each other using a sealant. After attaching the panel, a supporting plate is attached on a backside of the first substrate, and then a printed circuit board (PCB) is mounted on a backside of the supporting plate. Accordingly, a packaging element, such as a tape carrier package, can be stably connected to a pad of the array substrate and the PCB on the supporting plate. More specifically, a side portion for connecting to a drive IC of the TCP can be obtained by adding the supporting plate.

An organic ELD according to the present invention has several advantages. First, because the organic ELD is a top emission type, a high aperture ratio can be obtained. Second, because a supporting plate having better thermal conductivity than a substrate is attached to the substrate, overheating is prevented and the organic ELD operates stably. Third, by adding the supporting plate, a packaging element located at a side portion of the organic ELD as a bent shape, including a drive IC and a PCB, are stably affixed onto the organic ELD. Accordingly, production yield can be improved because defects, such as a detaching phenomenon of the TCP, are prevented by using the supporting plate. Fourth, because the array element layer and the organic EL diode are formed on their own respective substrates in a dual panel type organic ELD, undesirable defects due to a fabricating process of the organic EL diode can be prevented, thereby improving the overall production yield.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   an array element layer having a pad on a front side of a first substrate;
   an organic electroluminescent diode connected to the array element, the organic electroluminescent diode emitting light in an opposite direction away from the first substrate;
   a printed circuit board adjacent to a backside of the first substrate, the printed circuit board supplying the array element layer with external signals through the pad;
   a supporting plate between the backside of the first substrate and the printed circuit board, the supporting plate having better thermal conductivity than the first substrate; and
   an auxiliary supporting plate between the supporting plate and the printed circuit wherein the auxiliary supporting plate includes a material having a higher thermal conductivity than the supporting plate.

2. The device according to claim 1, wherein the supporting plate includes a carbon composite.

3. The device according to claim 1, wherein the supporting plate contacts the first substrate across the entire backside of the first substrate.

4. The device according to claim 1, wherein the auxiliary supporting plate is larger than the supporting plate and contacts a peripheral portion of the backside of the first substrate.

5. The device according to claim 1, wherein the auxiliary supporting plate includes acrylic resin.

6. The device according to claim 1, further comprising a packaging element between the pad and the printed circuit board, the pad and the printed circuit board being connected to each other through the packaging element, and the packaging element having a drive integrated circuit.

7. The device according to claim 6, wherein the packaging element corresponds to a tape carrier package.

8. The device according to claim 7, wherein the tape carrier package has a bent shape connecting the pad and the printed circuit board.

9. The device according to claim 8, wherein the drive integrated circuit of the tape carrier package corresponding to a side portion of the first substrate and the supporting plate.

10. The device according to claim 1, wherein the organic electroluminescent diode includes a first opaque electrode on the array element, an organic electroluminescent layer on the first electrode, and a second electrode substantially having a transparency on the organic electroluminescent layer, the organic electroluminescent layer emitting light toward the second electrode.

11. The device according to claim 10, wherein the first electrode acts as an anode.

12. The device according to claim 11, wherein the first electrode includes a transparent conductive material and an opaque material.

13. The device according to claim 10, wherein the second electrode acts as a cathode.

14. The device according to claim 13, wherein the second electrode includes a metallic material sufficiently thin to enable light transmission.

15. The device according to claim 1, further comprising a second substrate facing and spaced apart from the first substrate, the organic electroluminescent diode on the second substrate.

16. The device according to claim 15, further comprising a connection electrode connecting the array element and the organic electroluminescent diode.

17. The device according to claim 15, wherein the organic electroluminescent diode includes a first substantially transparent electrode on the second substrate, an organic electroluminescent layer on the first electrode, and a second opaque electrode on the organic electroluminescent layer, the organic electroluminescent layer emitting light toward the first electrode.

18. The device according to claim 17, wherein the first electrode acts as an anode.

19. The device according to claim 18, wherein the first electrode includes a transparent conductive material.

20. The device according to claim 17, wherein the second electrode acts as a cathode.

21. The device according to claim 20, wherein the second electrode includes an opaque metallic material.

22. The device according to claim 1, further comprising a passivation layer over the organic electroluminescent diode, the pad being exposed through the passivation layer.

23. The device according to claim 1, wherein the array element includes a gate line, a data line crossing the gate line and a power line crossing one of the gate and data lines.

24. The device according to claim 23, further comprising a switching thin film transistor connected to the gate and data lines and a driving thin film transistor connected to the switching thin film transistor and the power line.

25. The device according to claim 16, wherein the array element includes a gate line, a data line crossing the gate line, a power line crossing one of the gate and data lines, a switching thin film transistor connected to the gate and data lines, and a driving thin film transistor connected to the switching thin film transistor, the power line, and the connection electrode.

26. A method of fabricating an organic electroluminescent device, comprising:

forming an array element layer having a pad on a front side of a first substrate;

forming an organic electroluminescent diode connected to the array element, the organic electroluminescent diode emitting light in an opposite direction away from the first substrate; mounting a printed circuit board adjacent to a backside of the first substrate, the printed circuit board supplying the array element with external signals through the pad;

attaching a supporting plate between the backside of the first substrate and the printed circuit board, the supporting plate having better thermal conductivity than the first substrate; and attaching an auxiliary supporting plate between the supporting plate and the printed circuit board, wherein the auxiliary supporting plate includes a material having a higher thermal conductivity than the supporting plate.

27. The method according to claim 26, further comprising mounting a packaging element between the pad and the printed circuit board, the pad and the printed circuit board being connected to each other through the packaging element, and the packaging element having a drive integrated circuit.

28. The method according to claim 27, wherein the packaging element corresponds to a tape carrier package.

29. The method according to claim 27, wherein the drive integrated circuit corresponding to a side portion of the substrate and the supporting plate.

30. The method according to claim 26, further comprising preparing a second substrate facing and spaced apart from the first substrate, the organic electroluminescent diode on the second substrate.

31. The method according to claim 30, further comprising forming a connection electrode connecting the array element and the organic electroluminescent diode.

32. The method according to claim 26, further comprising forming a passivation layer over the organic electroluminescent diode, the pad uncovered by the passivation layer.

33. The method according to claim 26, wherein the forming the array element includes forming a gate line, a data line crossing the gate line and a power line crossing one of the gate and data lines.

34. The method according to claim 33, further comprising forming a switching thin film transistor connected to the gate and data lines and a driving thin film transistor connected to the switching thin film transistor and the power line.

35. The method according to claim 31, wherein forming the array element includes forming a gate line, a data line crossing the gate line and a power line crossing one of the gate and data lines, a switching thin film transistor connected to the gate and data lines, and a driving thin film transistor connected to the switching thin film transistor, the power line and the connection electrode.

* * * * *